(12) United States Patent
Tamura et al.

(10) Patent No.: US 11,635,692 B2
(45) Date of Patent: Apr. 25, 2023

(54) RESIST UNDERLYING FILM FORMING COMPOSITION

(71) Applicant: NISSAN CHEMICAL CORPORATION, Tokyo (JP)

(72) Inventors: Mamoru Tamura, Toyama (JP); Hiroto Ogata, Toyama (JP); Takahiro Kishioka, Toyama (JP)

(73) Assignee: NISSAN CHEMICAL CORPORATION, Tokyo (JP)

( * ) Notice: Subject to any disclaimer, the term of this patent is extended or adjusted under 35 U.S.C. 154(b) by 534 days.

(21) Appl. No.: 16/646,987

(22) PCT Filed: Sep. 19, 2018

(86) PCT No.: PCT/JP2018/034584
§ 371 (c)(1),
(2) Date: Mar. 12, 2020

(87) PCT Pub. No.: WO2019/059210
PCT Pub. Date: Mar. 28, 2019

(65) Prior Publication Data
US 2020/0209753 A1    Jul. 2, 2020

(30) Foreign Application Priority Data
Sep. 22, 2017   (JP) .............................. JP2017-182403

(51) Int. Cl.
| | |
|---|---|
| G03F 7/11 | (2006.01) |
| C09D 163/04 | (2006.01) |
| C08G 59/14 | (2006.01) |
| G03F 7/16 | (2006.01) |
| G03F 7/20 | (2006.01) |

(Continued)

(52) U.S. Cl.
CPC ................ *G03F 7/11* (2013.01); *C08G 59/14* (2013.01); *C09D 163/04* (2013.01); *G03F 7/162* (2013.01);
(Continued)

(58) Field of Classification Search
CPC . G03F 7/11; G03F 7/162; G03F 7/168; G03F 7/2004; G03F 7/322; G03F 7/38;
(Continued)

(56) References Cited

U.S. PATENT DOCUMENTS

| | | |
|---|---|---|
| 6,846,612 B2 | 1/2005 | Deshpande |
| 8,318,410 B2 | 11/2012 | Hiroi et al. |

(Continued)

FOREIGN PATENT DOCUMENTS

| | | |
|---|---|---|
| JP | 2006-504807 A | 2/2006 |
| JP | 2010-164965 A | 7/2010 |

(Continued)

OTHER PUBLICATIONS

Oct. 30, 2018 International Search Report issued in International Patent Application No. PCT/JP2018/034584.

*Primary Examiner* — Caleen O Sullivan
(74) *Attorney, Agent, or Firm* — Oliff PLC

(57) ABSTRACT

A resist underlayer film forming composition contains a resin containing a unit structure represented by formula (1): [in formula (1), R1 represents a thiadiazole group which is optionally substituted with a C1-6 alkyl group optionally interrupted by a carboxy group, a C1-6 alkyl group optionally substituted with a hydroxyl group, or a C1-4 alkylthio group, and R2 represents a hydrogen atom or formula (2): (in formula (2), R1 is the same as defined above, and * represents a binding moiety)]. The resist underlayer film forming composition provides a resist underlayer film which has excellent solvent resistance, excellent optical parameters, an excellent dry etching rate, and excellent embedability.

12 Claims, 2 Drawing Sheets

Example 1

Example 2

Example 3

Comparative Example 1

(51) Int. Cl.
*G03F 7/38* (2006.01)
*G03F 7/32* (2006.01)
*H01L 21/027* (2006.01)
*H01L 21/311* (2006.01)

(52) U.S. Cl.
CPC ............ *G03F 7/168* (2013.01); *G03F 7/2004* (2013.01); *G03F 7/322* (2013.01); *G03F 7/38* (2013.01); *H01L 21/0276* (2013.01); *H01L 21/31116* (2013.01); *H01L 21/31138* (2013.01)

(58) Field of Classification Search
CPC .......... G03F 7/094; G03F 7/091; G03F 7/004; G03F 7/0385; G03F 7/20; G03F 7/26; C08G 59/14; C08G 61/10; C08G 2261/145; C09D 163/04; H01L 21/0276; H01L 21/31116; H01L 21/31138; H01L 21/0271; C08L 63/04; C08L 65/00
USPC ......... 430/270.1, 271.1, 272.1, 311; 438/703
See application file for complete search history.

(56) References Cited

U.S. PATENT DOCUMENTS

| | | |
|---|---|---|
| 9,678,427 B2 | 6/2017 | Ogata et al. |
| 2003/0162125 A1 | 8/2003 | Deshpande |
| 2005/0118749 A1 | 6/2005 | Sakamoto et al. |
| 2011/0053091 A1 | 3/2011 | Hiroi et al. |
| 2015/0212418 A1 | 7/2015 | Nishimaki et al. |
| 2016/0222248 A1 | 8/2016 | Endo et al. |
| 2017/0038687 A1 | 2/2017 | Ogata et al. |
| 2018/0181001 A1 | 6/2018 | Endo et al. |

FOREIGN PATENT DOCUMENTS

| | | |
|---|---|---|
| JP | 2010-186174 A | 8/2010 |
| WO | 2003/071357 A1 | 8/2003 |
| WO | 2009/096340 A1 | 8/2009 |
| WO | 2014/024836 A1 | 2/2014 |
| WO | 2015/041208 A1 | 3/2015 |
| WO | 2015/098525 A1 | 7/2015 |
| WO | 2017/002653 A1 | 1/2017 |

RESIST UNDERLYING FILM FORMING COMPOSITION

TECHNICAL FIELD

The present invention relates to a resist underlying film forming composition which is excellent in all of the solvent resistance, optical parameter, dry etching rate, and encapsulation properties, a resist underlying film using the resist underlying film forming composition and a method for producing the same, a method for forming a resist pattern, and a method for producing a semiconductor device.

BACKGROUND ART

When a resist film is subjected to exposure, reflected waves can adversely affect the resist film. A resist underlying film formed for the purpose of suppressing the adverse effect has been called an antireflection film.

A demand is made on the resist underlying film such that the film can be easily formed merely by applying a resist underlying film forming composition in the form of a solution and curing the composition. Therefore, the composition for forming the resist underlying film needs to contain a compound (polymer) readily curable by heating, for example, and having a high solubility in a predetermined solvent.

It is desired that the resist pattern formed on the resist underlying film has a cross-section, taken along the direction perpendicular to the substrate, which is rectangular (straight bottom form free from the so-called undercut, footing and others). For example, when the resist pattern has an undercut or footing profile, problems are caused in that the resist pattern collapses, and in that a material to be processed (such as a substrate or an insulating film) cannot be processed into a desired form or size in the lithography step.

Further, the resist underlying film is required to have a larger dry etching rate than that of a resist film formed on the film, i.e., a large selective ratio for dry etching rate.

When a semiconductor substrate having depressed portions is used, the resist underlying film is required to be able to fill the depressed portions without any defect (which is frequently referred to as "void") merely by applying a resist underlying film forming composition to the substrate, irrespective of the size, depth, and form of the depressed portions.

Patent Literature 1 teaches a resist underlying film forming composition using a polymer having at least one sulfur atom in the structural unit thereof. By using the composition described in Patent Literature 1, a resist underlying film or antireflection film having a higher dry etching rate than that of the resist film can be obtained. Meanwhile, in the production of a semiconductor element, when a substrate having depressed portions on the surface is used, a gap filling material or planarization film capable of filling the depressed portions of the substrate is needed. However, Patent Literature 1 neither describes nor suggests the properties of filling the depressed portions.

Patent Literature 2 has a description of a resist underlying film forming composition using a copolymer having a triazine ring and a sulfur atom in the main chain thereof. By using the composition described in Patent Literature 2, there can be obtained a resist underlying film which has an even higher dry etching rate than that of the resist film, which functions as an antireflection film during the exposure without lowering the dry etching rate, and which can fill the hole in the semiconductor substrate.

Patent Literature 3 discloses an antireflection film having a high etching rate, wherein the antireflection film is obtained by grafting an epoxy novolak with a carboxylic acid.

CITATION LIST

Patent Literatures

Patent Literature 1: WO 2009/096340 A1
Patent Literature 2: WO 2015/098525 A1
Patent Literature 3: JP 2006-504807 A

SUMMARY OF INVENTION

Technical Problem

In the production of a semiconductor element, there is needed a resist underlying film which satisfies all the requirements that the resist underlying film have a high dry etching rate, that the film function as an antireflection film during the exposure, and that the film be able to fill depressed portions of a semiconductor substrate. However, when the depressed portions are a trench having a narrow space and a high aspect ratio, it is not easy to completely fill the depressed portions by using a conventional resist underlying film forming composition.

In view of the above problems to be solved, an object of the present invention is to provide a resist underlying film forming composition which is excellent in all of the solvent resistance, optical parameter, dry etching rate, and encapsulation properties. Another object of the present invention is to provide a resist underlying film using the above-mentioned resist underlying film forming composition and a method for producing the same, a method for forming a resist pattern, and a method for producing a semiconductor device.

Solution to Problem

The present invention encompasses the followings.

[1] A resist underlying film forming composition comprising a resin containing a unit structure represented by the following formula (1):

[Formula 1]

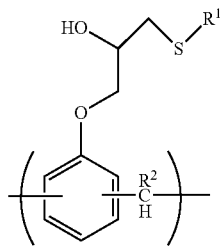

Formula (1)

wherein $R^1$ represents a $C_1$-$C_6$ alkyl group which is optionally interrupted by a carboxyl group, a $C_1$-$C_6$ alkyl group which is optionally substituted with a hydroxyl group, or a thiadiazole group which is optionally substituted with a $C_1$-$C_4$ alkylthio group, and $R^2$ represents a hydrogen atom or the following formula (2):

[Formula 2]

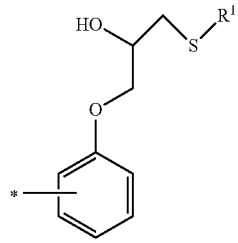

Formula (2)

wherein $R^1$ is as defined above, and * indicates a bonding site.

[2] A resist underlying film forming composition comprising a resin which is obtained by reacting a resin (A) containing (an) epoxy group(s) with a compound (B) having (a) thiol group(s).

[3] The resist underlying film forming composition according to item [2] above, wherein the resin (A) containing (an) epoxy group(s) is a phenolic novolak epoxy resin.

[4] A resist underlying film which is a baked product of an applied film comprising the resist underlying film forming composition according to any one of items [1] to [3] above.

[5] A method for forming a resist pattern characterized by being used for the manufacture of semiconductors, comprising the step of applying the resist underlying film forming composition according to any one of items [1] to [3] above onto a semiconductor substrate to form an applied film, and baking the applied film to form a resist underlying film.

[6] A method for producing a semiconductor device, comprising the steps of:

forming a resist underlying film comprising the resist underlying film forming composition according to any one of items [1] to [3] above on a semiconductor substrate;

forming a resist film on the resist underlying film;

irradiating the resist film with a light or an electron beam and subjecting the resultant resist film to development to form a resist pattern;

etching the resist underlying film through the formed resist pattern to form a patterned resist underlying film; and processing the semiconductor substrate using the patterned resist underlying film.

Advantageous Effects of Invention

The resist underlying film forming composition of the present invention has excellent solvent resistance, optical parameter, dry etching rate, and encapsulation, and achieves finer microfabrication for a substrate.

Particularly, the resist underlying film forming composition of the present invention is effective in a lithography process comprising forming at least two layers of resist underlying film aimed at reducing the thickness of the resist film and using the resist underlying film as an etching mask.

DESCRIPTION OF EMBODIMENTS

1. Resist Underlying Film Forming Composition

Figure 1:
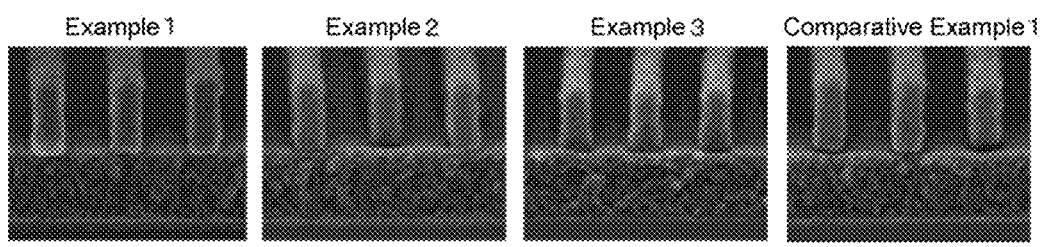
FIG. 1 Scanning electron microscope (SEM) photomicrographs obtained by taking pictures of the cross-section, taken along the direction perpendicular to the silicon wafer, for evaluating the photoresist pattern form.

The resist underlying film forming composition of the present invention is a resist underlying film forming composition comprising a resin containing a unit structure represented by the following formula (1):

[Formula 3]

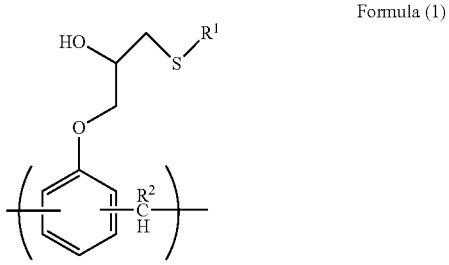

Formula (1)

wherein $R^1$ represents a $C_1$-$C_6$ alkyl group optionally interrupted by a carboxyl group, a $C_1$-$C_6$ alkyl group optionally substituted with a hydroxyl group, or a thiadiazole group optionally substituted with a $C_1$-$C_4$ alkylthio group, and $R^2$ represents a hydrogen atom or the following formula (2):

[Formula 4]

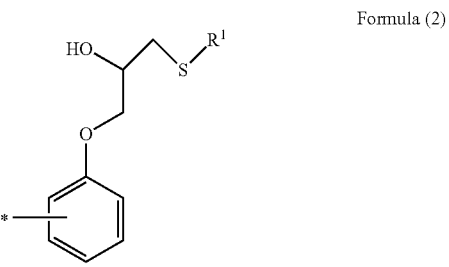

Formula (2)

wherein $R^1$ is as defined above, and * indicates a bonding site.

The $C_1$-$C_6$ alkyl group means an alkyl group having 1 to 6 carbon atoms, and examples of such alkyl groups include linear alkyl groups, such as a methyl group, an ethyl group, a n-propyl group, a n-butyl group, a n-pentyl group, and a n-hexyl group; branched alkyl groups, such as an isopropyl group, a sec-butyl group, a tert-butyl group, an isopentyl group, a neopentyl group, a 1-methylpentyl group, and an isohexyl group; and cyclic alkyl groups, such as a cyclopropyl group, a cyclobutyl group, a cyclopentyl group, and a cyclohexyl group. Preferred are a methyl group, an ethyl group, and a n-propyl group, and more preferred are an ethyl group and a n-propyl group.

The $C_1$-$C_6$ alkyl group is optionally interrupted by one or more carboxyl groups, and the direction of bonding for the interruption may be any of —COO— and —OCO—. Further, the interruption may be twice or more, but is preferably once.

The $C_1$-$C_6$ alkyl group is optionally substituted with a hydroxyl group, and the substitution may be once, or twice or more. Two or more hydroxyl groups may be bonded to the same single carbon atom, but are preferably bonded to different carbon atoms.

The thiadiazole group may be any of a 1,2,3-thiadiazole group, a 1,2,5-thiadiazole group, and a 1,3,4-thiadiazole group, but is preferably a 1,3,4-thiadiazole group.

The thiadiazole group is optionally substituted with a $C_1$-$C_4$ alkylthio group, and the substitution may be once, or twice or more. Two or more $C_1$-$C_4$ alkylthio groups may be bonded to the same single atom, but are preferably bonded to different atoms.

The $C_1$-$C_4$ alkylthio group means an alkyl group having 1 to 4 carbon atoms, and examples of such alkylthio groups include linear alkylthio groups, such as a methylthio group, an ethylthio group, a n-propylthio group, and a n-butylthio group; branched alkylthio groups, such as an isopropylthio group, a sec-butylthio group, and a tert-butylthio group; and cyclic alkylthio groups, such as a cyclopropylthio group and a cyclobutylthio group. Preferred are a methylthio group, an ethylthio group, and a n-propylthio group, and most preferred is a methylthio group.

A 1,2,3-thiadiazole group generally has S bonded at one of the 4- and 5-positions and has an optional $C_1$-$C_4$ alkylthio group bonded at the other.

A 1,2,5-thiadiazole group generally has S bonded at one of the 3- and 4-positions and has an optional $C_1$-$C_4$ alkylthio group bonded at the other.

A 1,3,4-thiadiazole group generally has S bonded at one of the 2- and 5-positions and has an optional $C_1$-$C_4$ alkylthio group bonded at the other.

The resin containing a unit structure represented by formula (1) above can be produced by, for example, reacting resin (A) containing (an) epoxy group(s) with compound (B) having (a) thiol group(s). Consequently, the produced resin is a polymer having a main chain derived from resin (A) containing (an) epoxy group(s) and a side chain derived from compound (B) having (a) thiol group(s).

1.1. Resin (A) Containing (an) Epoxy Group(s)

Resin (A) containing (an) epoxy group(s) is typically a compound represented by the general formula (3) below, and is classified into a phenolic novolak epoxy resin and a cresol novolak epoxy resin.

General formula (3)

[Formula 5]

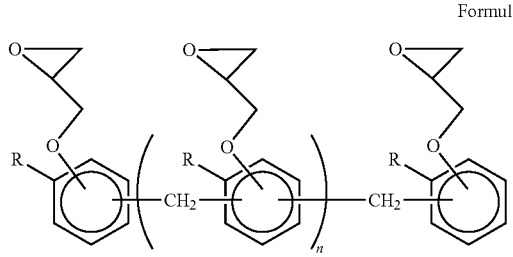

Formula (3)

In formula (3), each R is independently a methyl group or a hydrogen atom, and n is an integer of 2 to 100.

It is preferred that resin (A) containing (an) epoxy group(s) is a phenolic novolak epoxy resin. Specific examples of novolak epoxy resins include phenolic novolak epoxy resin EPPN-501H (manufactured by Nippon Kayaku Co., Ltd.) and phenolic novolak epoxy resin D.E.N.™438 (manufactured by The Dow Chemical Company).

One type, or two or more types of resins (A) containing (an) epoxy group(s) may be used in combination, but preferably three types or less, further preferably two types or less of resins (A) containing (an) epoxy group(s) are used in combination.

1.2. Compound (B) Having (a) Thiol Group(s)

With respect to compound (B) having (a) thiol group(s), any of a monofunctional thiol compound having one thiol group in the molecule thereof and a multifunctional thiol compound having a plurality of thiol groups in the molecule thereof may be used. Specific examples of such compounds include thioglycolic acid, thioglycolic acid monoethanolamine, methyl thioglycolate, octyl thioglycolate, methoxybutyl thioglycolate, ethylene glycol bisthioglycolate, butanediol bisthioglycolate, hexanediol bisthioglycolate, trimethylolpropane tristhioglycolate, pentaerythritol tetrakisthioglycolate, 3-mercaptopropionic acid, methyl mercaptopropionate, methoxybutyl mercaptopropionate, octyl mercaptopropionate, tridecyl mercaptopropionate, ethylene glycol bisthiopropionate, butanediol bisthiopropionate, trimethylolpropane tristhiopropionate, pentaerythritol tetrakisthiopropionate, pentaerythritol tetrakis(3-mercaptobutyrate), trimethylolpropane tris(3-mercaptobutyrate), trimethylolethane tris(3-mercaptobutyrate), thioglycerol, 4-mercapto-5-methylthio-1,2,3-thiadiazole, 4-methylthio-5-mercapto-1,2,3-thiadiazole, 3-mercapto-4-methylthio-1,2,5-thiadiazole, 3-methylthio-4-mercapto-1,2,5-thiadiazole, 2-mercapto-5-methylthio-1,3,4-thiadiazole, and 2-methylthio-5-mercapto-1,3,4-thiadiazole.

Of these, preferred are thioglycolic acid, thioglycolic acid monoethanolamine, methyl thioglycolate, octyl thioglycolate, methoxybutyl thioglycolate, thioglycerol, 2-mercapto-5-methylthio-1,3,4-thiadiazole, and 2-methylthio-5-mercapto-1,3,4-thiadiazole.

One type, or two or more types of compounds (B) having (a) thiol group(s) may be used in combination.

1.3. Polymer

Resin (A) containing (an) epoxy group(s) and compound (B) having (a) thiol group(s) can be arbitrarily selected as long as they are within the above-described respective ranges, but it is desired that resin (A) containing (an) epoxy group(s) and compound (B) having (a) thiol group(s) are selected so that the obtained polymer is satisfactorily dissolved in the above-mentioned solvent used in the present invention and the resist underlying film forming composition which can pass through a microfilter having a pore diameter of 0.2 μm (more preferably a pore diameter of 0.1 μm) is obtained.

The amount of the incorporated compound (B) having (a) thiol group(s), relative to 100 parts by weight of resin (A) containing (an) epoxy group(s), is preferably 10 to 200 parts by weight, more preferably 20 to 100 parts by weight, most preferably 40 to 90 parts by weight.

With respect to the catalyst used in the reaction, any catalyst selected from known catalysts may be used. Examples of catalysts include phosphonium salts, such as tetramethylphosphonium chloride, tetramethylphosphonium bromide, tetraethylphosphonium chloride, tetraethylphosphonium bromide, tetra-n-butylphosphonium chloride, tetra-n-butylphosphonium bromide, tetra-n-butylphosphonium iodide, tetra-n-hexylphosphonium bromide, tetra-n- octylphosphonium bromide, methyltriphenylphosphonium bromide, methyltriphenylphosphonium iodide, ethyltriphenylphosphonium bromide, ethyltriphenylphosphonium iodide, n-butyltriphenylphosphonium bromide, n-butyltriphenylphosphonium iodide, n-hexyltriphenylphosphonium bromide, n-octyltriphenylphosphonium bromide, tetraphenylphosphonium bromide, tetrakishydroxymethylphosphonium chloride, tetrakishydroxymethylphosphonium bromide, tetrakishydroxyethylphosphonium chloride, and tetrakishydroxybutylphosphonium chloride. The amount of the catalyst used varies and is selected depending on the type of the acid used. The amount of the catalyst used is generally 0.1 to 20 mol %, preferably 0.5 to 10 mol %, more preferably 1 to 5 mol %, based on the epoxy molar number of resin (A) containing (an) epoxy group(s).

The above-mentioned reaction can be conducted without a solvent, but is generally conducted using a solvent. Any solvent may be used as long as it does not inhibit the reaction. When the resist underlying film forming composition of the present invention is used in the state of a uniform solution, taking the application performance of the composition into consideration, it is recommended that the solvent be selected from solvents generally used in a lithography step. Details of this are described in item 1.6 below.

The reaction temperature is generally 23 to 200° C. The reaction time varies and is selected depending on the reaction temperature, but is generally about 30 minutes to 50 hours.

The thus obtained polymer generally has a weight average molecular weight Mw of 500 to 2,000,000, or 600 to 100,000, or 700 to 10,000, or 800 to 8,000, or 900 to 6,000.

As a result of the reaction, a polymer containing repeating units represented by formula (1) above is obtained, and further a polymer mixture having resin (A) containing (an) epoxy group(s) and compound (B) having (a) thiol group(s) complicatedly bonded to each other is obtained, and, for this reason, to define the polymer directly by its structure is not practical.

The resist underlying film forming composition of the present invention preferably further comprises a crosslinking agent, an acid and/or an acid generator, a solvent, and other components. These are individually descried below.

1.4. Crosslinking Agent

The resist underlying film forming composition of the present invention may contain a crosslinking agent component. Examples of the crosslinking agents include melamines, substituted ureas, and polymers thereof. Preferred are crosslinking agents having at least two crosslinkable substituents, and examples include compounds, such as methoxymethylated glycoluril, butoxymethylated glycoluril, methoxymethylated melamine, butoxymethylated melamine, methoxymethylated benzoguanamine, butoxymethylated benzoguanamine, methoxymethylated urea, butoxymethylated urea, and methoxymethylated thiourea. For example, tetramethoxymethylglycoluril (trade name: Powderlink 1174, manufactured by Nihon Cytec Industries Inc.) is available. Condensation products of the above compound can also be used.

Further, with respect to the crosslinking agent, a crosslinking agent having high heat resistance may be used. As a crosslinking agent having high heat resistance, a compound containing in the molecule thereof a crosslinkable substituent having an aromatic ring (for example, a benzene ring or a naphthalene ring) can be preferably used.

Examples of the compounds include compounds having a partial structure of the following formula (4), and polymers or oligomers having repeating units of the following formula (5).

[Formula 6]

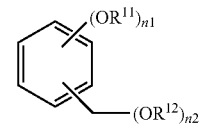

Formula (4)

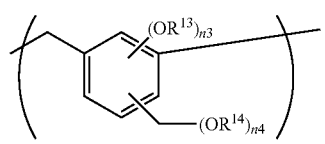

Formula (5)

In the above formulae, $R^{11}$, $R^{12}$, $R^{13}$, and $R^{14}$ are a hydrogen atom or an alkyl group having 1 to 10 carbon atoms. Examples of alkyl groups having 1 to 10 carbon atoms include linear or branched alkyl groups optionally having a substituent, such as a methyl group, an ethyl group, a n-propyl group, an isopropyl group, a n-butyl group, a sec-butyl group, a tert-butyl group, a n-pentyl group, an isopentyl group, a neopentyl group, a n-hexyl group, an isohexyl group, a n-heptyl group, a n-octyl group, a cyclohexyl group, a 2-ethylhexyl group, a n-nonyl group, an isononyl group, a p-tert-butylcyclohexyl group, and a n-decyl group.

Each of n1 and n2 represents an integer of 0 to 6, and each of n3 and n4 represents an integer of 0 to 4.

Examples of compounds, polymers, and oligomers of the formulae (4) and (5), may include the followings.

[Formula 7]

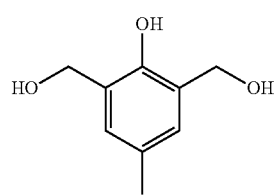

Formula (4-1)

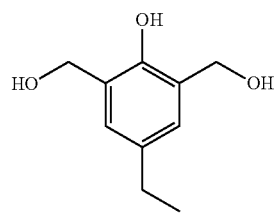

Formula (4-2)

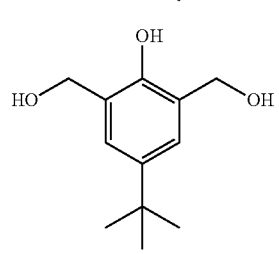

Formula (4-3)

-continued
Formula (4-4)
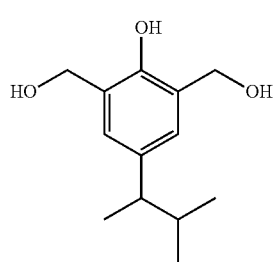
Formula (4-5)
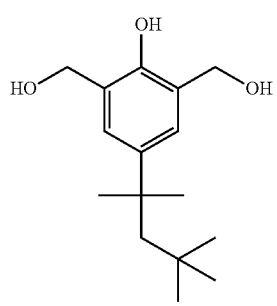
Formula (4-6)
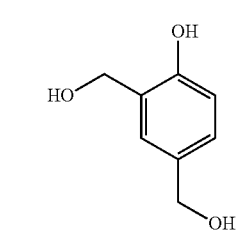
Formula (4-7)
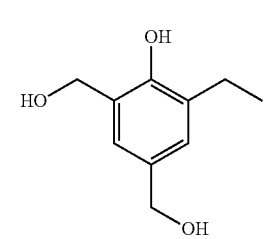
Formula (4-8)
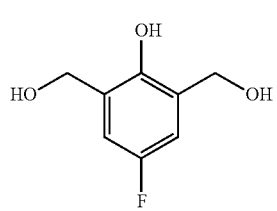
Formula (4-9)
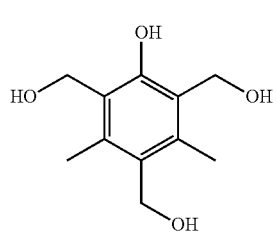
-continued
Formula (4-10)
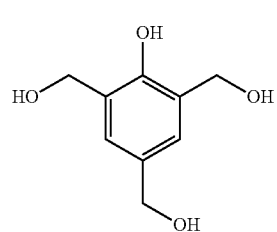
Formula (4-11)
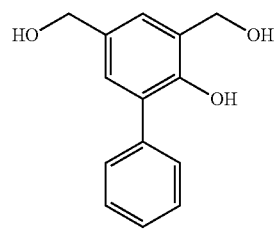
Formula (4-12)
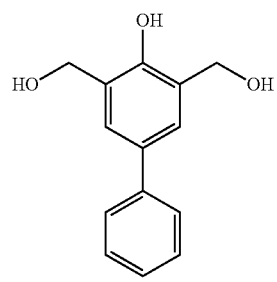
Formula (4-13)
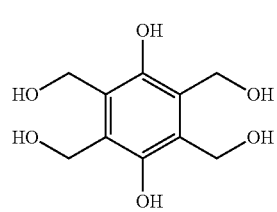
Formula (4-14)
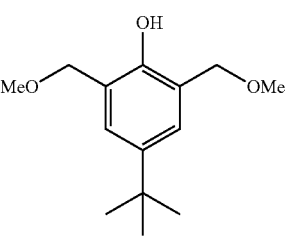
Formula (4-15)
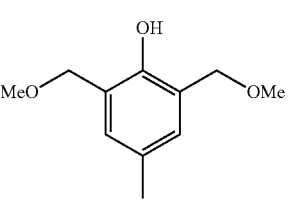
[Formula 8]
Formula (4-16)
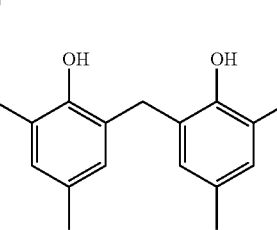

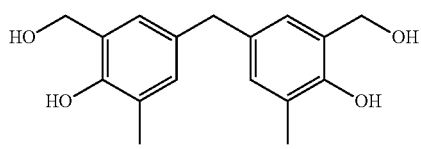

Formula (4-17)

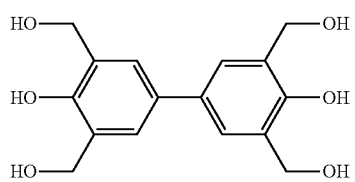

Formula (4-18)

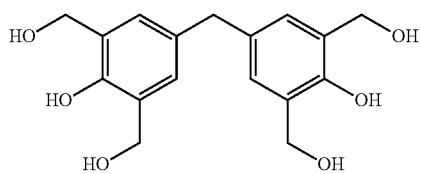

Formula (4-19)

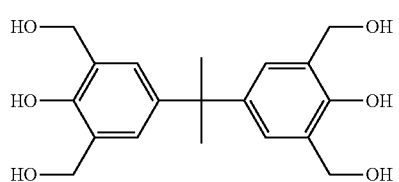

Formula (4-20)

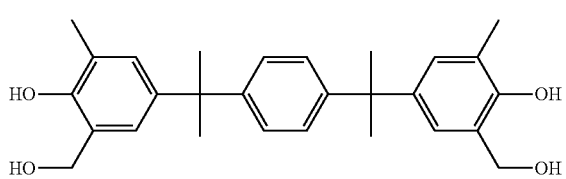

Formula (4-21)

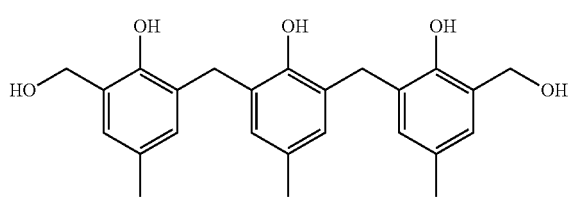

Formula (4-22)

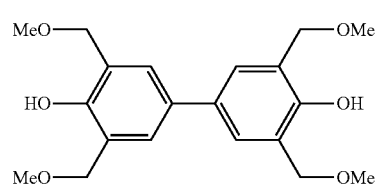

Formula (4-23)

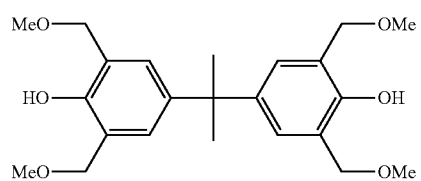

Formula (4-24)

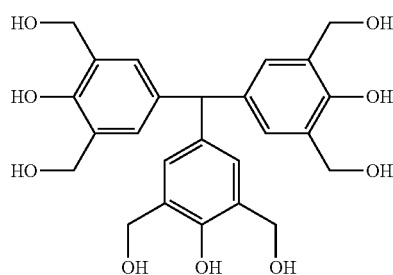

Formula (4-25)

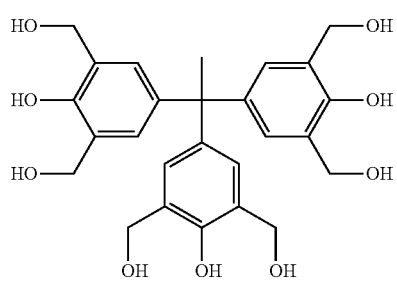

Formula (4-26)

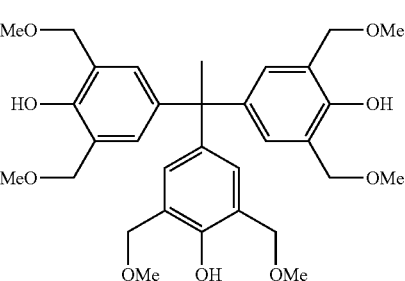

Formula (4-27)

The above-mentioned compounds are available as products of Asahi Yukizai Corporation and Honshu Chemical Industry Co., Ltd. For example, of the above-mentioned crosslinking agents, the compound of formula (4-23) is available under the trade name: TMOM-BP (manufactured by Honshu Chemical Industry Co., Ltd.), and the compound of formula (4-24) is available under the trade name: TM-BIP-A (manufactured by Asahi Yukizai Corporation).

The amount of the crosslinking agent added varies depending on, for example, the application solvent used, the substrate used, the required solution viscosity, or the required film form, but is 0.001 to 80% by mass, preferably 0.01 to 50% by mass, further preferably 0.05 to 40% by mass, based on the mass of the total solid of the composition. The crosslinking agent possibly causes a crosslinking reaction due to self-condensation, but the crosslinking agent and the crosslinkable substituent present in the above-mentioned polymer in the present invention can together cause a crosslinking reaction.

1.5. Acid and Acid Generator

In the present invention, as a catalyst for accelerating the crosslinking reaction, an acid and/or an acid generator may be added. For example, an acid compound, such as p-toluenesulfonic acid, trifluoromethanesulfonic acid, pyridinium p-toluenesulfonate, salicylic acid, 5-sulfosalicylic acid, 4-phenolsulfonic acid, camphorsulfonic acid, 4-chlorobenzenesulfonic acid, benzenedisulfonic acid, 1-naphthalenesulfonic acid, citric acid, benzoic acid, hydroxybenzoic acid, or naphthalenecarboxylic acid, and/or 2,4,4,6-tetrabromocyclohexadienone, benzoin tosylate, 2-nitrobenzyl tosylate, a pyridinium salt compound, such as pyridinium p-hydroxybenzenesulfonate, pyridinium p-toluenesulfonate, or pyridinium trifluoromethanesulfonate, or a thermal acid generator, such as an organic sulfonic acid alkyl ester, may be incorporated. The amount of the acid or acid generator incorporated is 0.0001 to 20% by mass, preferably 0.0005 to 10% by mass, further preferably 0.01 to 3% by mass, based on the mass of the total solid of the composition.

The resist underlying film forming composition of the present invention may contain an acid generator. Examples of acid generators include a thermal acid generator and a photo-acid generator.

The photo-acid generator generates an acid during the exposure for the resist. Therefore, it is possible to control the acidity of the resist underlying film. This is a method for making the acidity of the resist underlying film consistent with the acidity of the resist as an upper layer. Further, by controlling the acidity of the resist underlying film, the pattern form for a resist formed as an upper layer can be controlled.

Examples of the photo-acid generators contained in the resist underlying film forming composition of the present invention include onium salt compounds, sulfonimide compounds, and disulfonyldiazomethane compounds.

Examples of onium salt compounds include iodonium salt compounds, such as diphenyliodonium hexafluorophosphate, diphenyliodonium trifluoromethanesulfonate, diphenyliodonium nonafluoronormalbutanesulfonate, diphenyliodonium perfluoronormaloctanesulfonate, diphenyliodonium camphorsulfonate, bis(4-tert-butylphenyl)iodonium camphorsulfonate, and bis(4-tert-butylphenyl)iodonium trifluoromethanesulfonate; and sulfonium salt compounds, such as triphenylsulfonium hexafluoroantimonate, triphenylsulfonium nonafluoronormalbutanesulfonate, triphenylsulfonium camphorsulfonate, and triphenylsulfonium trifluoromethanesulfonate.

Examples of sulfonimide compounds include N-(trifluoromethanesulfonyloxy)succinimide, N-(nonafluoronormalbutanesulfonyloxy)succinimide, N-(camphorsulfonyloxy)succinimide, and N-(trifluoromethanesulfonyloxy)naphthalimide.

Examples of disulfonyldiazomethane compounds include bis(trifluoromethylsulfonyl)diazomethane, bis(cyclohexylsulfonyl)diazomethane, bis(phenylsulfonyl)diazomethane, bis(p-toluenesulfonyl)diazomethane, bis(2,4-dimethylbenzenesulfonyl)diazomethane, and methylsulfonyl-p-toluenesulfonyldiazomethane.

The photo-acid generator may be used alone or in combination.

When a photo-acid generator is used, the amount of the photo-acid generator is 0.01 to 5 parts by mass, or 0.1 to 3 parts by mass, or 0.5 to 1 part by mass, relative to 100 parts by mass of the solid of the resist underlying film forming composition.

1.6. Solvent

The resist underlying film forming composition of the present invention can be prepared by dissolving the above-mentioned polymer in a solvent, and is used in a uniform solution state.

With respect to the solvent for the resist underlying film forming composition of the present invention, there is no particular limitation as long as it is a solvent which can dissolve therein the above-mentioned polymer, and any of such solvents may be used. Particularly, when the resist underlying film forming composition of the present invention is used in a uniform solution state, taking the application properties of the composition into consideration, it is recommended that a solvent generally used in a lithography process should be also used.

Examples of such solvents include methyl cellosolve acetate, ethyl cellosolve acetate, propylene glycol, propylene glycol monomethyl ether, propylene glycol monoethyl ether, methylisobutyl carbinol, propylene glycol monobutyl ether, propylene glycol monomethyl ether acetate, propylene glycol monoethyl ether acetate, propylene glycol monopropyl ether acetate, propylene glycol monobutyl ether acetate, toluene, xylene, methyl ethyl ketone, cyclopentanone, cyclohexanone, ethyl 2-hydroxypropionate, ethyl 2-hydroxy-2-methylpropionate, ethyl ethoxyacetate, ethyl hydroxyacetate, methyl 2-hydroxy-3-methylbutanoate, methyl 3-methoxypropionate, ethyl 3-methoxypropionate, ethyl 3-ethoxypropionate, methyl 3-ethoxypropionate, methyl pyruvate, ethyl pyruvate, ethylene glycol monomethyl ether, ethylene glycol monoethyl ether, ethylene glycol monopropyl ether, ethylene glycol monobutyl ether, ethylene glycol monomethyl ether acetate, ethylene glycol monoethyl ether acetate, ethylene glycol monopropyl ether acetate, ethylene glycol monobutyl ether acetate, diethylene glycol dimethyl ether, diethylene glycol diethyl ether, diethylene glycol dipropyl ether, diethylene glycol dibutyl ether, propylene glycol monomethyl ether, propylene glycol dimethyl ether, propylene glycol diethyl ether, propylene glycol dipropyl ether, propylene glycol dibutyl ether, ethyl lactate, propyl lactate, isopropyl lactate, butyl lactate, isobutyl lactate, methyl formate, ethyl formate, propyl formate, isopropyl formate, butyl formate, isobutyl formate, amyl formate, isoamyl formate, methyl acetate, ethyl acetate, amyl acetate, isoamyl acetate, hexyl acetate, methyl propionate, ethyl propionate, propyl propionate, isopropyl propionate, butyl propionate, isobutyl propionate, methyl butyrate, ethyl butyrate, propyl butyrate, isopropyl butyrate, butyl butyrate, isobutyl butyrate, ethyl hydroxyacetate, ethyl 2-hydroxy-2-methylpropionate, methyl 3-methoxy-2-methylpropionate, methyl 2-hydroxy-3-methylbutyrate, ethyl methoxyacetate, ethyl ethoxyacetate, methyl 3-methoxypropionate, ethyl 3-ethoxypropionate, ethyl 3-methoxypropionate, 3-methoxybutyl acetate, 3-methoxypropyl acetate, 3-methyl-3-methoxybutyl acetate, 3-methyl-3-methoxybutyl propionate, 3-methyl-3-methoxybutyl butyrate, methyl acetoacetate, toluene, xylene, methyl ethyl ketone, methyl propyl ketone, methyl butyl ketone, 2-heptanone, 3-heptanone, 4-heptanone, cyclohexanone, N,N-dimethylformamide, N-methylacetamide, N,N-dimethylacetamide, N-methylpyrrolidone, 4-methyl-2-pentanol, and γ-butyrolactone. The solvent may be used alone or in combination.

Of these solvents, preferred are propylene glycol monomethyl ether, propylene glycol monomethyl ether acetate, ethyl lactate, butyl lactate, and cyclohexanone. Especially preferred are propylene glycol monomethyl ether and propylene glycol monomethyl ether acetate.

The resist underlying film forming composition of the present invention may contain, as a solvent, a compound represented by the following formula (6):

[Formula 9]

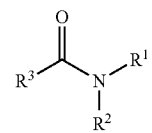

Formula (6)

wherein each of R¹, R², and R³ represents a hydrogen atom or an alkyl group having 1 to 20 carbon atoms and being optionally interrupted by an oxygen atom, a sulfur atom, or an amide linkage, and they may be the same or different, and may optionally be bonded together to form a cyclic structure.

The compound represented by formula (6) and the above-mentioned solvent may be used in combination as long as the solvent is compatible with the compound and can dissolve therein the above-mentioned polymer.

Examples of alkyl groups having 1 to 20 carbon atoms include linear or branched alkyl groups optionally having a substituent, such as a methyl group, an ethyl group, a n-propyl group, an isopropyl group, a n-butyl group, a sec-butyl group, a tert-butyl group, a n-pentyl group, an isopentyl group, a neopentyl group, a n-hexyl group, an isohexyl group, a n-heptyl group, a n-octyl group, a cyclohexyl group, a 2-ethylhexyl group, a n-nonyl group, an isononyl group, a p-tert-butylcyclohexyl group, a n-decyl group, a n-dodecylnonyl group, an undecyl group, a dodecyl group, a tridecyl group, a tetradecyl group, a pentadecyl group, a hexadecyl group, a heptadecyl group, an octadecyl group, a nonadecyl group, and an eicosyl group. Preferred are alkyl groups having 1 to 12 carbon atoms, more preferred are alkyl groups having 1 to 8 carbon atoms, and further preferred are alkyl groups having 1 to 4 carbon atoms.

Examples of alkyl groups having 1 to 20 carbon atoms and being interrupted by an oxygen atom, a sulfur atom, or an amide linkage include alkyl groups containing a structural unit —CH₂—O—, —CH₂—S—, —CH₂—NHCO—, or —CH₂—CONH—. With respect to —O—, —S—, —NHCO—, or —CONH—, one unit or two or more units may be present in the alkyl group. Specific examples of alkyl groups having 1 to 20 carbon atoms and being interrupted by an —O—, —S—, —NHCO—, or —CONH— unit include a methoxy group, an ethoxy group, a propoxy group, a butoxy group, a methylthio group, an ethylthio group, a propylthio group, a butylthio group, a methylcarbonylamino group, an ethylcarbonylamino group, a propylcarbonylamino group, a butylcarbonylamino group, a methylaminocarbonyl group, an ethylaminocarbonyl group, a propylaminocarbonyl group, and a butylaminocarbonyl group, and further include a methyl group, an ethyl group, a propyl group, a butyl group, a pentyl group, a hexyl group, a heptyl group, an octyl group, a nonyl group, a decyl group, a dodecyl group, and an octadecyl group, each of which is substituted with, for example, a methoxy group, an ethoxy group, a propoxy group, a butoxy group, a methylthio group, an ethylthio group, a propylthio group, a butylthio group, a methylcarbonylamino group, an ethylcarbonylamino group, a methylaminocarbonyl group, or an ethylaminocarbonyl group. Preferred are a methoxy group, an ethoxy group, a methylthio group, and an ethylthio group, and more preferred are a methoxy group and an ethoxy group.

These solvents have a relatively high boiling point, and therefore are effective in imparting high encapsulation properties or high planarization properties to the resist underlying film forming composition.

Specific preferred examples of the compounds represented by formula (6) are shown below.

[Formula 10]

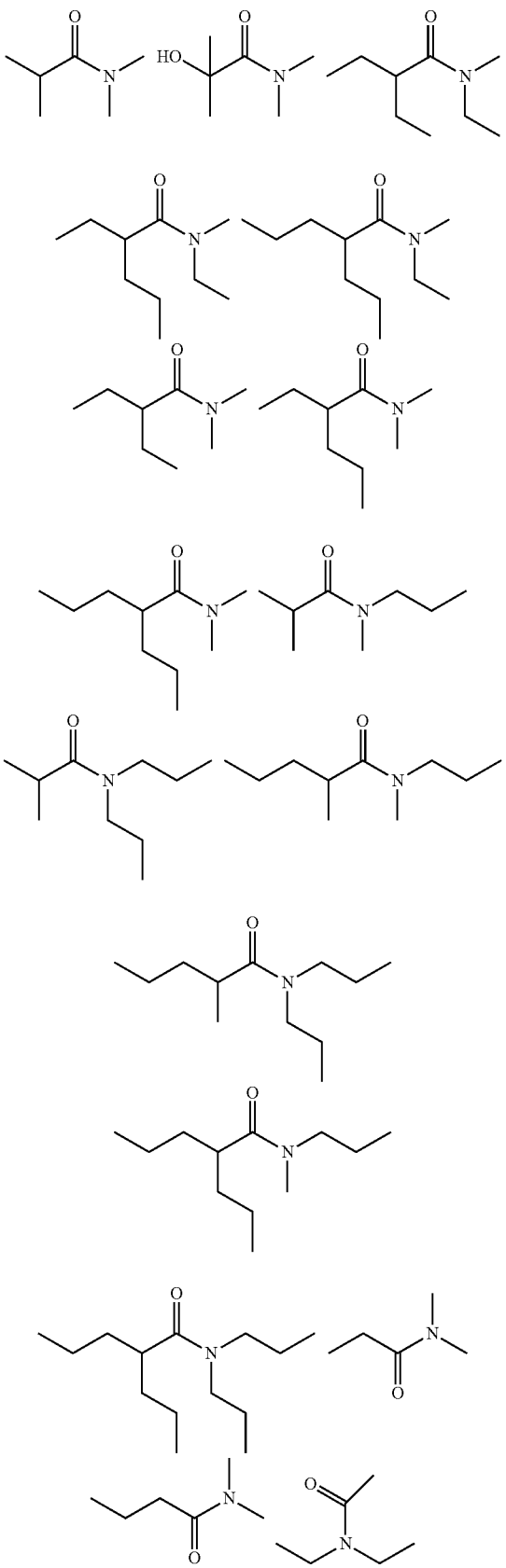

-continued

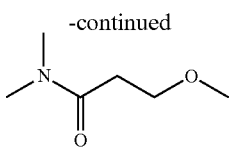

Of the compounds shown above, preferred are 3-methoxy-N,N-dimethylpropionamide, N,N-dimethylisobutylamide, and compounds represented by the following formulae:

[Formula 11]

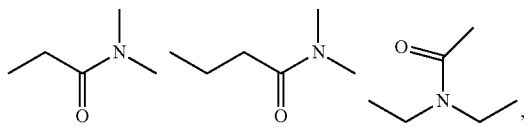

and, with respect to the compound represented by formula (6), especially preferred are 3-methoxy-N,N-dimethylpropionamide and N,N-dimethylisobutylamide.

The compound represented by formula (6) above exhibits an effect even when contained in a slight amount in the resist underlying film forming composition. Therefore, with respect to the amount of the compound incorporated into the resist underlying film forming composition, there is no particular limitation. It is preferred that the compound represented by formula (6) is contained in an amount of 5% by weight or more, based on the weight of the resist underlying film forming composition of the present invention. Further, it is preferred that the compound represented by formula (6) is contained in an amount of 30% by weight or less, based on the weight of the resist underlying film forming composition of the present invention.

1.7. Surfactant

A surfactant may be incorporated into the resist underlying film forming composition of the present invention for further improving the application properties with respect to the surface unevenness to prevent, for example, the occurrence of pinholes or striation. Examples of surfactants include nonionic surfactants, e.g., polyoxyethylene alkyl ethers, such as polyoxyethylene lauryl ether, polyoxyethylene stearyl ether, polyoxyethylene cetyl ether, and polyoxyethylene oleyl ether; polyoxyethylene alkyl aryl ethers, such as polyoxyethylene octylphenol ether and polyoxyethylene nonylphenol ether; polyoxyethylene-polyoxypropylene block copolymers; sorbitan fatty acid esters, such as sorbitan monolaurate, sorbitan monopalmitate, sorbitan monostearate, sorbitan monooleate, sorbitan trioleate, and sorbitan tristearate; and polyoxyethylene sorbitan fatty acid esters, such as polyoxyethylene sorbitan monolaurate, polyoxyethylene sorbitan monopalmitate, polyoxyethylene sorbitan monostearate, polyoxyethylene sorbitan trioleate, and polyoxyethylene sorbitan tristearate, fluorine surfactants, such as EFTOP EF301, EF303, EF352 (trade name, manufactured by Tohchem Products Co., Ltd.), MEGAFACE F171, F173, R-40, R-40N, R-40LM (trade name, manufactured by DIC Corporation), Fluorad FC430, FC431 (trade name, manufactured by Sumitomo 3M), and AsahiGuard AG710, Surflon S-382, SC101, SC102, SC103, SC104, SC105, SC106 (trade name, manufactured by Asahi Glass Co., Ltd.), and organosiloxane polymer KP341 (manufactured by Shin-Etsu Chemical Co., Ltd.). The amount of the surfactant incorporated is generally 2.0% by mass or less, preferably 1.0% by mass or less, based on the mass of the solid of the resist underlying film forming composition. The surfactant may be used alone or in combination. When a surfactant is used, the amount of the surfactant is 0.0001 to 5 parts by mass, or 0.001 to 1 part by mass, or 0.01 to 0.5 part by mass, relative to 100 parts by mass of the solid of the resist underlying film forming composition.

1.8. Other Components

In the resist underlying film forming composition for lithography of the present invention, for example, a light absorber, a rheology modifier, or a bonding auxiliary may be added. The rheology modifier is effective in improving the fluidity of the resist underlying film forming composition. The bonding auxiliary is effective in improving the adhesion between the resist underlying film and a semiconductor substrate or a resist.

With respect to the light absorber, for example, any commercially available light absorbers described in "Kougyo-you Shikiso no Gijutsu to Shijou (Techniques and Markets of Industrial Dyes)" (CMC Publishing Co., Ltd.) or "Senryo Binran (Dye Handbook)" (edited by The Society of Synthetic Organic Chemistry, Japan), for example, C. I. Disperse Yellow 1, 3, 4, 5, 7, 8, 13, 23, 31, 49, 50, 51, 54, 60, 64, 66, 68, 79, 82, 88, 90, 93, 102, 114, and 124; C. I. Disperse Orange 1, 5, 13, 25, 29, 30, 31, 44, 57, 72, and 73; C. I. Disperse Red 1, 5, 7, 13, 17, 19, 43, 50, 54, 58, 65, 72, 73, 88, 117, 137, 143, 199, and 210; C. I. Disperse Violet 43; C. I. Disperse Blue 96; C. I. Fluorescent Brightening Agent 112, 135, and 163; C. I. Solvent Orange 2 and 45; C. I. Solvent Red 1, 3, 8, 23, 24, 25, 27, and 49; C. I. Pigment Green 10; and C. I. Pigment Brown 2 may be preferably used. The light absorber is generally incorporated in an amount of 10% by mass or less, preferably 5% by mass or less, based on the mass of the solid of the resist underlying film forming composition for lithography.

A rheology modifier may be added mainly for the purpose of improving the fluidity of the resist underlying film forming composition, particularly for improving the uniformity of the thickness of the resist underlying film or the filling of the inside of hole with the resist underlying film forming composition in the baking step. Specific examples of rheology modifiers include phthalic acid derivatives, such as dimethyl phthalate, diethyl phthalate, diisobutyl phthalate, dihexyl phthalate, and butylisodecyl phthalate; adipic acid derivatives, such as dinormalbutyl adipate, diisobutyl adipate, diisooctyl adipate, and octyldecyl adipate; maleic acid derivatives, such as dinormalbutyl maleate, diethyl maleate, and dinonyl maleate; oleic acid derivatives, such as methyl oleate, butyl oleate, and tetrahydrofurfuryl oleate; and stearic acid derivatives, such as normalbutyl stearate and glyceryl stearate. The rheology modifier may be incorporated generally in an amount of less than 30% by mass, based on the mass of the solid of the resist underlying film forming composition for lithography.

A bonding auxiliary may be added mainly for the purpose of improving the adhesion between the resist underlying film forming composition and a substrate or a resist to prevent the resist from peeling off particularly in the development. Specific examples of bonding auxiliaries include chlorosilanes, such as trimethylchlorosilane, dimethylmethylolchlorosilane, methyldiphenylchlorosilane, and chloromethyldimethylchlorosilane; alkoxysilanes, such as trimethylmethoxysilane, dimethyldiethoxysilane, methyldimethoxysilane, dimethylmethylolethoxysilane, diphenyldimethoxysilane, and phenyltriethoxysilane; silazanes, such as hexamethyldisilazane, N,N'-bis(trimethylsilyl)urea, dimethyltrimethylsilylamine, and trimethylsilylimidazole; silanes, such as methyloltrichlorosilane, γ-chloropropyltrimethoxysilane, γ-aminopropyltriethoxysilane, and γ-glycidoxypropyltrimethoxysilane; heterocyclic compounds, such as benzotriazole, benzimidazole, indazole, imidazole, 2-mercaptobenzimidazole, 2-mercaptobenzothiazole, 2-mercaptobenzoxazole, urazole, thiouracil, mercaptoimidazole, and mercaptopyrimidine; and urea or thiourea compounds, such as 1,1-dimethylurea and 1,3-dimethylurea. The bonding auxiliary may be generally incorporated in an amount of less than 5% by mass, preferably less than 2% by mass, based on the mass of the solid of the resist underlying film forming composition for lithography.

1.9. Resist Underlying Film Forming Composition

The resist underlying film forming composition of the present invention generally has a solid content of 0.1 to 70% by mass, preferably 0.1 to 60% by mass. The solid content indicates a content of the solids remaining after removing the solvent from the all components of the resist underlying film forming composition. The proportion of the polymer in the solids is, in the order of increasing preference, 1 to 100% by mass, 1 to 99.9% by mass, 50 to 99.9% by mass, 50 to 95% by mass, and 50 to 90% by mass.

One of the measures for checking whether the resist underlying film forming composition is in a uniform solution state is to observe the capability of the composition passing through a specific microfilter, and the resist underlying film forming composition of the present invention is in a uniform solution state such that the composition can pass through a microfilter having a pore diameter of 0.2 μm.

Examples of materials for the microfilter include fluororesins, such as PTFE (polytetrafluoroethylene) and PFA (tetrafluoroethylene-perfluoroalkyl vinyl ether copolymer), PE (polyethylene), UPE (ultra-high molecular weight polyethylene), PP (polypropylene), PSF (polysulfone), PES (polyether sulfone), and nylon, and a microfilter made of PTFE (polytetrafluoroethylene) is preferred.

2. Resist Underlying Film and Method for Producing a Semiconductor Device

Hereinbelow, a resist underlying film using the resist underlying film forming composition of the present invention and a method for producing a semiconductor device will be described.

The resist underlying film of the present invention is a baked product of an applied film comprising the above-mentioned resist underlying film forming composition.

The resist underlying film forming composition of the present invention is applied onto a substrate used in the manufacture of a semiconductor device (for example, a silicon wafer substrate, a silicon/silicon dioxide coated substrate, a silicon nitride substrate, a glass substrate, an ITO substrate, a polyimide substrate, or a low permittivity material (low-k material) coated substrate) by an appropriate application method, such as a spinner or a coater, and then baked to form a resist underlying film. Conditions for baking are generally appropriately selected from those at a baking temperature of 80 to 250° C. for a baking time of 0.3 to 60 minutes. Preferred conditions for baking are those at a baking temperature of 150 to 250° C. for a baking time of 0.5 to 2 minutes. The thickness of the formed resist underlying film is, for example, 10 to 1,000 nm, or 20 to 500 nm, or 30 to 300 nm, or 50 to 300 nm, or 50 to 200 nm.

Further, an inorganic resist underlying film (hard mask) may be formed on the organic resist underlying film of the present invention. For example, an inorganic resist underlying film can be formed by a method of applying the silicon-containing resist underlying film (inorganic resist underlying film) forming composition described in WO2009/104552 A1 by spin coating, or a Si inorganic material film can be formed by, for example, a CVD method.

Further, by applying the resist underlying film forming composition of the present invention onto a semiconductor substrate which has portions having steps and portions having no step (so-called stepped substrate) followed by baking, the resist underlying film can be formed so as to have steps between the portions of the substrate having steps and those having no step falling within the range of from 3 to 50 nm.

Then, for example, a layer of photoresist is formed on the resist underlying film. The layer of photoresist can be formed by a known method, namely, by applying a photoresist composition solution onto the resist underlying film and baking the applied composition. The thickness of the photoresist is, for example, 10 to 10,000 nm, or 50 to 2,000 nm, or 100 to 1,000 nm.

With respect to the photoresist formed on the resist underlying film, there is no particular limitation as long as it is sensitive to a light used in the exposure. Any of a negative photoresist and a positive photoresist may be used. There are, for example, a positive photoresist comprising a novolak resin and 1,2-naphthoquinonediazidosulfonate, a chemical amplification photoresist comprising a binder having a group which is decomposed due to an acid to increase the alkali solubility, and a photo-acid generator, a chemical amplification photoresist comprising a low-molecular weight compound which is decomposed due to an acid to increase the alkali solubility of the photoresist, an alkali-soluble binder, and a photo-acid generator, and a chemical amplification photoresist comprising a binder having a group which is decomposed due to an acid to increase the alkali solubility, a low-molecular weight compound which is decomposed due to an acid to increase the alkali solubility of the photoresist, and a photo-acid generator. For example, there can be mentioned trade name: V146G, manufactured by JSR Corporation, trade name: APEX-E, manufactured by Shipley Company, Inc., trade name: PAR710, manufactured by Sumitomo Chemical Co., Ltd., and trade name: AR2772, SEPR430, manufactured by Shin-Etsu Chemical Co., Ltd. Further, there can be mentioned fluorine atom-containing polymer photoresists described in, for example, Proc. SPIE, Vol. 3999, 330-334 (2000), Proc. SPIE, Vol. 3999, 357-364 (2000), and Proc. SPIE, Vol. 3999, 365-374 (2000).

Next, exposure through a predetermined mask is conducted. In the exposure, for example, a near ultraviolet light, a far ultraviolet light, or an extreme ultraviolet light (for example, an EUV (wavelength: 13.5 nm)) is used. Specifically, for example, a KrF excimer laser (wavelength: 248 nm), an ArF excimer laser (wavelength: 193 nm), or an $F_2$ excimer laser (wavelength: 157 nm) may be used. Of these, an ArF excimer laser (wavelength: 193 nm) and an EUV (wavelength: 13.5 nm) are preferred. After the exposure, if necessary, post exposure bake can be performed. The post exposure bake is performed under conditions appropriately selected from those at a heating temperature of 70 to 150° C. for a heating time of 0.3 to 10 minutes.

Further, in the present invention, as a resist, instead of the photoresist, a resist for electron beam lithography may be used. Any of a negative electron beam resist and a positive electron beam resist may be used. There are, for example, a chemical amplification resist comprising an acid generator and a binder having a group which is decomposed due to an acid to change the alkali solubility, a chemical amplification resist comprising an alkali-soluble binder, an acid generator, and a low-molecular weight compound which is decomposed due to an acid to change the alkali solubility of the resist, a chemical amplification resist comprising an acid generator, a binder having a group which is decomposed due to an acid to change the alkali solubility, and a low-molecular weight compound which is decomposed due to an acid to change the alkali solubility of the resist, a non-chemical amplification resist comprising a binder having a group which is decomposed due to an electron beam to change the alkali solubility, and a non-chemical amplification resist comprising a binder having a site which suffers breakage due to an electron beam to change the alkali solubility. Also when using the above electron beam resist, a resist pattern can be similarly formed as in the case where a photoresist is used and an electron beam is used as a source of irradiation.

Then, development using a developer is conducted. In the development, for example, when a positive photoresist is used, the exposed portion of the photoresist is removed, so that a photoresist pattern is formed.

Examples of developers include alkaline aqueous solutions, e.g., aqueous solutions of an alkali metal hydroxide, such as potassium hydroxide or sodium hydroxide, aqueous solutions of a quaternary ammonium hydroxide, such as tetramethylammonium hydroxide, tetraethylammonium hydroxide, or choline, and aqueous solutions of an amine, such as ethanolamine, propylamine, or ethylenediamine. Further, for example, a surfactant may be added to the above developer. Conditions for the development are appropriately selected from those at a temperature of 5 to 50° C. for a time of 10 to 600 seconds.

Subsequently, using the thus formed photoresist (upper layer) pattern as a protective film, the inorganic underlying film (intermediate layer) is removed, and then, using a film comprising the patterned photoresist and inorganic underlying film (intermediate layer) as a protective film, the organic underlying film (lower layer) is removed. Finally, using the patterned inorganic underlying film (intermediate layer) and organic underlying film (lower layer) as a protective film, processing of the semiconductor substrate is performed.

First, a portion of the inorganic underlying film (intermediate layer), from which the photoresist is removed, is removed by dry etching so that the semiconductor substrate is exposed. In the dry etching for the inorganic underlying film, for example, a gas of tetrafluoromethane ($CF_4$), perfluorocyclobutane ($C_4F_8$), perfluoropropane ($C_3F_8$), trifluoromethane, carbon monoxide, argon, oxygen, nitrogen, sulfur hexafluoride, difluoromethane, nitrogen trifluoride, chlorine trifluoride, chlorine, trichloroborane, or dichloroborane may be used. In the dry etching for the inorganic underlying film, a halogen-based gas is preferably used, and a fluorine-based gas is more preferably used. Examples of fluorine-based gases include tetrafluoromethane ($CF_4$), perfluorocyclobutane ($C_4F_8$), perfluoropropane ($C_3F_8$), trifluoromethane, and difluoromethane ($CH_2F_2$).

Then, using a film comprising the patterned photoresist and inorganic underlying film as a protective film, the organic underlying film is removed. The organic underlying film (lower layer) is preferably removed by dry etching using an oxygen-based gas. The reason for this is that the inorganic underlying film containing silicon atoms in a large amount is unlikely to be removed by dry etching using an oxygen-based gas.

Finally, processing of the semiconductor substrate is conducted. The processing of the semiconductor substrate is preferably conducted by dry etching using a fluorine-based gas.

Examples of fluorine-based gases include tetrafluoromethane ($CF_4$), perfluorocyclobutane ($C_4F_8$), perfluoropropane ($C_3F_8$), trifluoromethane, and difluoromethane ($CH_2F_2$).

Further, before forming the photoresist, an organic anti-reflection film may be formed on the resist underlying film as an upper layer. With respect to the antireflection film composition used in forming the antireflection film, there is no particular limitation, and an antireflection film composition may be arbitrarily selected from those which are commonly used in a lithography process, and an antireflection film can be formed by a method commonly used, for example, by applying the composition using a spinner or a coater and baking it.

In the present invention, an organic underlying film is formed on a substrate, and then an inorganic underlying film is formed on the organic film, and the resultant film can be covered with a photoresist. By virtue of this, even when a substrate is covered with a photoresist having a smaller thickness for preventing an occurrence of pattern collapse due to a reduced pattern width of the photoresist, appropriate selection of an etching gas enables processing of the substrate. For example, processing of the resist underlying film can be made by using as an etching gas a fluorine-based gas showing a satisfactorily faster etching rate than for the photoresist; processing of the substrate can be made by using as an etching gas a fluorine-based gas showing a satisfactorily faster etching rate than for the inorganic underlying film; and processing of the substrate can be made by using as an etching gas an oxygen-based gas showing a satisfactorily faster etching rate than for the organic underlying film.

The resist underlying film formed from the resist underlying film forming composition may absorb the light used in a lithography process depending on the wavelength of the light. In such a case, the resist underlying film can function as an antireflection film, which has an effect of preventing a light reflected from the substrate. Further, the resist underlying film formed from the resist underlying film forming composition of the present invention can function as a hard mask. The resist underlying film of the present invention can also be used, for example, as a layer for preventing an interaction between a substrate and a photoresist; as a layer having a function of preventing any adverse effect on a substrate of the material used in a photoresist or a substance formed during the exposure for the photoresist; as a layer having a function of preventing a substance generated from a substrate upon heating or baking from diffusing into a photoresist as an upper layer; and as a barrier layer for reducing the photoresist layer poisoning effect of a semiconductor substrate dielectric layer.

Further, the resist underlying film formed from the resist underlying film forming composition is applied to a substrate having formed via holes used in a dual-damascene process, and may be used as an encapsulation material capable of completely filling holes. Furthermore, the resist underlying film can also be used as a planarization material for making the uneven surface of a semiconductor substrate flat.

Alternatively, processing of the semiconductor substrate may be conducted without forming the inorganic underlying film (intermediate layer). Specifically, the organic underlying film (lower layer, which corresponds to the resist underlying film of the present invention) is removed using the photoresist (upper layer) pattern formed as described above as a protective film. The organic underlying film (lower layer) is preferably removed by dry etching using an oxygen-based gas. Finally, processing of the semiconductor substrate is performed using the organic underlying film (lower layer) as a protective film. The processing of the semiconductor substrate is conducted as above.

EXAMPLES

Hereinbelow, the present invention will be described in more detail with reference to the following Examples and others, which should not be construed as limiting the scope of the present invention.

[Synthesis of a Resin]

The apparatus used in the measurement of the weight average molecular weight of the reaction products obtained in the following Synthesis Examples is shown below.
Apparatus: HLC-8320GPC, manufactured by Tosoh Corp.
GPC Column: Asahipak [registered trademark] GF-310HQ, Asahipak GF-510HQ, and Asahipak GF-710HQ
Column temperature: 40° C.
Flow rate: 0.6 mL/minute
Eluent: DMF
Standard sample: Polystyrene Synthesis Example 1

To a flask equipped with a stirrer, a thermometer, and a Dimroth condenser were added 197.62 g of propylene glycol monomethyl ether (hereinafter, abbreviated to "PGME"), 30.00 g of phenolic novolak epoxy resin D.E.N.™438 (manufactured by The Dow Chemical Company), 17.84 g of methyl thioglycolate, and 1.56 g of ethyltriphenylphosphonium bromide as a catalyst, and then the resultant mixture was subjected to a reaction at 100° C. for 24 hours to obtain a solution containing the reaction product. GPC analysis of the obtained reaction product showed that the reaction product had a weight average molecular weight of 3,100, as determined using a conversion calibration curve obtained from the standard polystyrene. The obtained reaction product is presumed to be a polymer having a structural unit represented by the following formula.

[Formula 12]

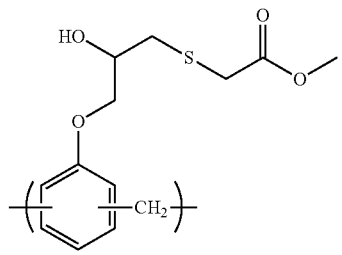

Synthesis Example 2

To a flask equipped with a stirrer, a thermometer, and a Dimroth condenser were added 210.29 g of PGME, 30.00 g of phenolic novolak epoxy resin D.E.N.™438 (manufactured by The Dow Chemical Company), 12.73 g of thioglycerol, 8.28 g of 2-mercapto-5-methylthio-1,3,4-thiadiazole, and 1.56 g of ethyltriphenylphosphonium bromide as a catalyst, and then the resultant mixture was subjected to a reaction at 100° C. for 24 hours to obtain a solution containing the reaction product. GPC analysis of the obtained reaction product showed that the reaction product had a weight average molecular weight of 3,250, as determined using a conversion calibration curve obtained from the standard polystyrene. The obtained reaction product is presumed to be a polymer having structural units represented by the following formula.

[Formula 13]

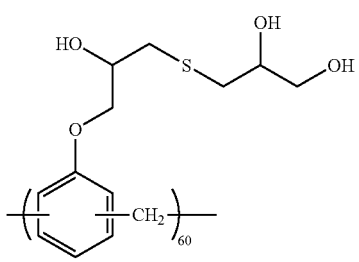

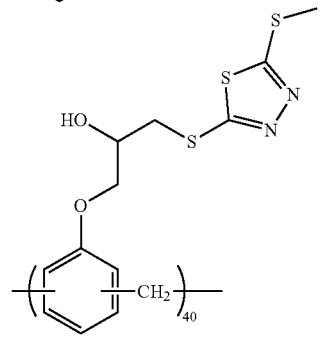

Synthesis Example 3

To a flask equipped with a stirrer, a thermometer, and a Dimroth condenser were added 310.14 g of PGME, 40.00 g of phenolic novolak epoxy resin EPPN-501H (manufactured by Nippon Kayaku Co., Ltd.), 7.77 g of thioglycerol, 27.54 g of 2-mercapto-5-methylthio-1,3,4-thiadiazole, and 2.22 g of ethyltriphenylphosphonium bromide as a catalyst, and then the resultant mixture was subjected to a reaction at 100° C. for 24 hours to obtain a solution containing the reaction product. GPC analysis of the obtained reaction product showed that the reaction product had a weight average molecular weight of 1,520, as determined using a conversion calibration curve obtained from the standard polystyrene. The obtained reaction product is presumed to be a polymer having a structural unit represented by the following formula.

[Formula 14]

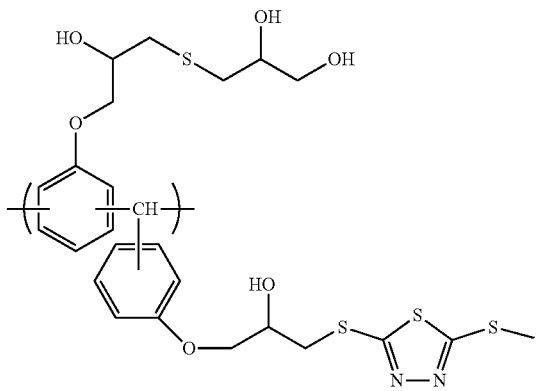

Comparative Synthesis Example 1

To a flask equipped with a stirrer, a thermometer, and a Dimroth condenser were added 208.36 g of PGME, 30.00 g of phenolic novolak epoxy resin D.E.N.™438 (manufactured by The Dow Chemical Company), 20.53 g of benzoic acid, and 1.56 g of ethyltriphenylphosphonium bromide as a catalyst, and then the resultant mixture was subjected to a reaction at 100° C. for 24 hours to obtain a solution containing the reaction product. GPC analysis of the obtained reaction product showed that the reaction product had a weight average molecular weight of 3,200, as determined using a conversion calibration curve obtained from the standard polystyrene. The obtained reaction product is presumed to be a polymer having a structural unit represented by the following formula.

[Formula 15]

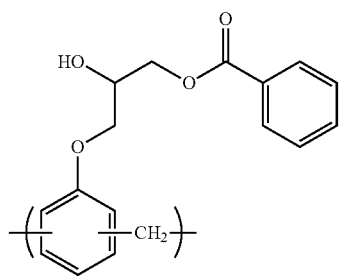

[Preparation of a Resist Underlying Film Forming Composition]

Example 1

Into 4.07 g of the solution obtained in Synthesis Example 1 containing 0.82 g of the polymer (using as a solvent PGME used in the synthesis) were mixed 2.24 g of PGME, 1.31 g of propylene glycol monomethyl ether acetate (hereinafter, abbreviated to "PGMEA"), 0.16 g of tetramethoxymethylglycoluril (trade name: Powderlink 1174, manufactured by Nihon Cytec Industries Inc.), 3.06 g of a 1% by mass PGME solution of pyridinium trifluoromethanesulfonate (manufactured by Tokyo Chemical Industry Co., Ltd.), 4.07 g of a 1% by mass PGME solution of gallic acid hydrate (manufactured by Tokyo Chemical Industry Co., Ltd.), and 0.08 g of a 1% by mass PGME solution of a surfactant (trade name: R-30N, manufactured by DIC Corporation) to obtain a 7% by mass solution. The obtained solution was subjected to filtration using a polytetrafluoroethylene microfilter having a pore diameter of 0.2 μm to prepare a resist underlying film forming composition.

Example 2

Into 4.24 g of the solution obtained in Synthesis Example 2 containing 0.85 g of the polymer (using as a solvent PGME used in the synthesis) were mixed 1.82 g of PGME, 1.31 g of PGMEA, 0.13 g of tetramethoxymethylglycoluril (trade name: Powderlink 1174, manufactured by Nihon Cytec Industries Inc.), 3.18 g of a 1% by mass PGME solution of K-PURE [registered trademark] TAG 2689 (manufactured by King Industries, Inc.), 4.24 g of a 1% by mass PGME solution of gallic acid hydrate (manufactured by Tokyo Chemical Industry Co., Ltd.), and 0.08 g of a 1% by mass PGME solution of a surfactant (trade name: R-30N, manufactured by DIC Corporation) to obtain a 7% by mass solution. The obtained solution was subjected to filtration using a polytetrafluoroethylene microfilter having a pore diameter of 0.2 μm to prepare a resist underlying film forming composition.

Example 3

Into 4.04 g of the solution obtained in Synthesis Example 3 containing 0.81 g of the polymer (using as a solvent PGME used in the synthesis) were mixed 1.34 g of PGME, 1.32 g of PGMEA, 0.16 g of tetramethoxymethylglycoluril (trade name: Powderlink 1174, manufactured by Nihon Cytec Industries Inc.), 4.04 g of a 1% by mass PGME solution of pyridinium paraphenolsulfonate (manufactured by Tokyo Chemical Industry Co., Ltd.), 4.04 g of a 1% by mass PGME solution of gallic acid hydrate (manufactured by Tokyo Chemical Industry Co., Ltd.), and 0.08 g of a 1% by mass PGME solution of a surfactant (trade name: R-30N, manufactured by DIC Corporation) to obtain a 7% by mass solution. The obtained solution was subjected to filtration using a polytetrafluoroethylene microfilter having a pore diameter of 0.2 μm to prepare a resist underlying film forming composition.

Comparative Example 1

Into 4.11 g of the solution obtained in Comparative Example 1 containing 0.82 g of the polymer (using as a solvent PGME used in the synthesis) were mixed 7.23 g of PGME, 1.31 g of PGMEA, 0.21 g of tetramethoxymethylglycoluril (trade name: Powderlink 1174, manufactured by Nihon Cytec Industries Inc.), 2.06 g of a 1% by mass PGME solution of pyridinium paraphenolsulfonate (manufactured by Tokyo Chemical Industry Co., Ltd.), and 0.08 g of a 1% by mass PGME solution of a surfactant (trade name: R-30N, manufactured by DIC Corporation) to obtain a 7% by mass solution. The obtained solution was subjected to filtration using a polytetrafluoroethylene microfilter having a pore diameter of 0.2 μm to prepare a resist underlying film forming composition.

[Test for dissolution into a photoresist solvent]

Each of the resist underlying film forming compositions prepared in Examples 1 to 3 and Comparative Example 1 was applied by a spinner onto a silicon wafer. Then, the resultant applied film was baked on a hotplate at a temperature of 215° C. for one minute to form a resist underlying film (thickness: 0.2 μm). The formed resist underlying film was immersed in PGME and propylene glycol monomethyl ether acetate, which are solvents used in the photoresist solution, to check whether the film was insoluble in each of the solvents. Separately, the formed resist underlying film was immersed in an alkaline developer for photoresist development (2.38% by mass aqueous solution of tetramethylammonium hydroxide) to check whether the film was insoluble in the developer. "0" indicates that the film was insoluble, and "x" indicates that the film was dissolved. The results are shown in Table 1.

[Test for Optical Parameter]

Each of the resist underlying film forming compositions prepared in Examples 1 to 3 and Comparative Example 1 was applied by a spinner onto a silicon wafer. Then, the resultant applied film was baked on a hotplate at a temperature of 215° C. for one minute to form a resist underlying film (thickness: 0.2 μm). With respect to the formed resist underlying film, using a spectroscopic ellipsometer (VUV-VASE VU-302, manufactured by J. A. Woollam Co., Inc.), a refractive index (n value) and an attenuation coefficient (k value) at a wavelength of 193 nm were measured. The results are shown in Table 1 below. For achieving satisfactory antireflection ability, the k value at 193 nm of the resist underlying film is desirably 0.1 or more.

[Measurement of a Dry Etching Rate]

Using each of the resist underlying film forming compositions prepared in Examples 1 to 3 and Comparative Example 1, a resist underlying film was formed on a silicon wafer by the same method as described above. Then, a dry etching rate of the formed resist underlying film was measured using RIE System, manufactured by Samco Inc., under conditions using N2 as a dry etching gas. Separately, a photoresist solution (trade name: V146G, manufactured by JSR Corporation) was applied by a spinner onto a silicon wafer, and the resultant applied film was baked on a hotplate at a temperature of 110° C. for one minute to form a photoresist film. A dry etching rate of the formed photoresist film was measured using the above-mentioned RIE System, manufactured by Samco Inc., under conditions using N2 as a dry etching gas. The dry etching rate of each resist underlying film calculated when the dry etching rate of the photoresist film was taken as 1.00 was determined as a "selective ratio". For achieving excellent processing using dry etching, the selective ratio is desirably 1.5 or more. The results are shown in Table 1 below.

[Evaluation of the Photoresist Pattern Form]

Each of the resist underlying film forming compositions prepared in Examples 1 to 3 and Comparative Example 1 was applied by a spinner onto a silicon wafer. Then, the resultant applied film was baked on a hotplate at 215° C. for one minute to form a resist underlying film having a thickness of 0.2 μm. A commercially available photoresist solution (trade name: AR2772, manufactured by Shin-Etsu Chemical Co., Ltd.) was applied by a spinner onto the resist underlying film, and the resultant applied film was baked on a hotplate at 110° C. for 60 seconds to form a photoresist film (thickness: 0.20 μm).

Using a scanner NSRS307E, manufactured by Nikon Corporation (wavelength: 193 nm; NA: 0.85; a: 0.62/0.93 (ANNULAR)), the formed photoresist film was subjected to exposure through a photomask set so that 100 lines were formed wherein the line width of the photoresist after development and the width between the lines in the photoresist were 0.10 μm, i.e., 0.10 μm L/S (dense line). Then, the resultant exposed film was subjected to post exposure bake (PEB) on a hotplate at 110° C. for 60 seconds, and cooled and then subjected to development using a 0.26 N aqueous solution of tetramethylammonium hydroxide as a developer by a 60-second single puddle step according to the industrial standards, obtaining a photoresist pattern. With respect to the obtained photoresist pattern, a cross-section, taken along the direction perpendicular to the substrate, i.e., the silicon wafer, was examined by means of a scanning electron microscope (SEM). "O" indicates a sample such that the photoresist was formed on the substrate and had excellent straight bottom form, and "x" indicates a sample other than the above sample. The results are shown in Table 1, and SEM images obtained by taking pictures of the cross-sections of photoresist patterns are shown in FIG. 1.

[Test for Encapsulation (Filling Properties)]

Each of the resist underlying film forming compositions prepared in Examples 1 to 3 and Comparative Example 1 was applied by a spinner onto a silicon wafer having a plurality of trenches (width: 0.01 μm; depth: 0.23 μm) and having an $SiO_2$ film formed on the surface thereof (hereinafter, referred to simply as "$SiO_2$ wafer" in the present specification). Then, the resultant applied film was baked on a hotplate at a temperature of 215° C. for one minute to form a resist underlying film (thickness: 0.2 μm).

Figure 2:
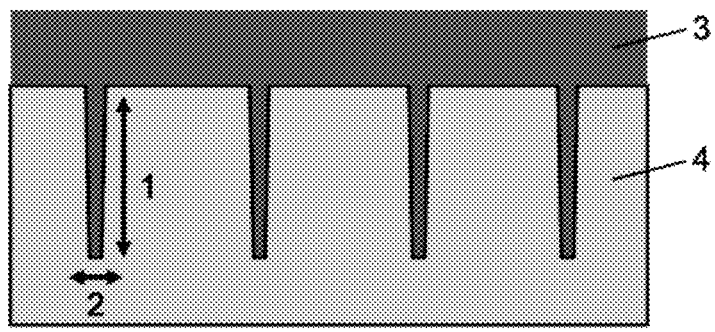
FIG. 2 A diagrammatic view of the $SiO_2$ wafer used in the evaluation of encapsulation (filling properties) and the resist underlying film formed on the wafer.

FIG. 2 shows a diagrammatic view of $SiO_2$ wafer 4 used in the present test and resist underlying film 3 formed on the wafer. The $SiO_2$ wafer 4 has a dense pattern of trenches, and the dense pattern is a pattern such that a distance between the center of a trench and the center of the adjacent trench is 10 times the width of each trench. As shown in FIG. 2, in $SiO_2$ wafer 4, depth 1 of the trench is 0.23 μm, and width 2 of the trench is 0.01 μm.

Figure 3:
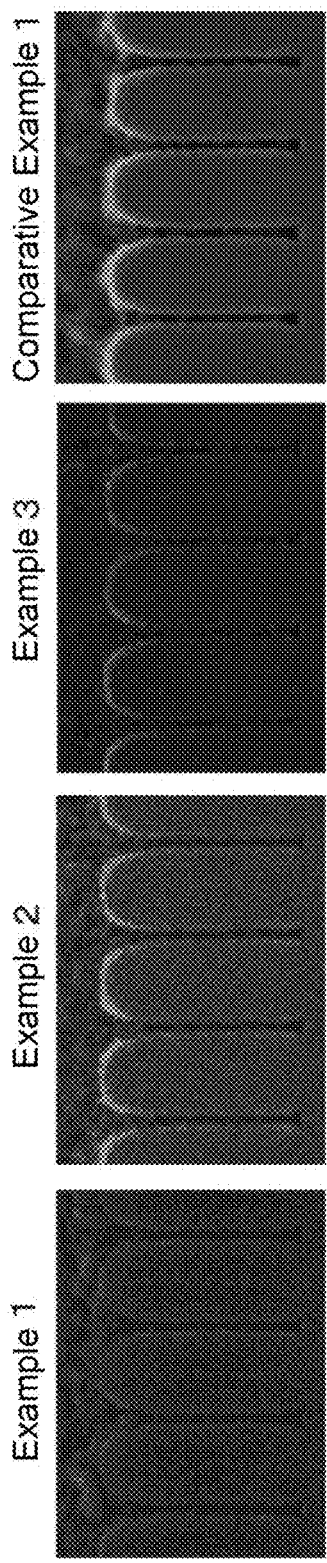
FIG. 3 Scanning electron microscope (SEM) photomicrographs obtained by taking pictures of the cross-section profile of an $SiO_2$ wafer for evaluating the encapsulation (filling properties) of the resist underlying film for trenches of the $SiO_2$ wafer.

With respect to the resist underlying film formed as above on the $SiO_2$ wafer using each of the resist underlying film forming compositions in Examples 1 to 3 and Comparative Example 1, the encapsulation (filling properties) of the resist underlying film for the trenches of the $SiO_2$ wafer was evaluated by observing the cross-section profile of the $SiO_2$ wafer using a scanning electron microscope (SEM). "O" indicates a sample such that the whole of trenches were completely encapsulated, and "X" indicates a sample such that a void was formed in the trench portion. The results are shown in Table 1, and SEM images obtained by taking pictures of the cross-sections are shown in FIG. 3.

TABLE 1

| | Solvent resistance | | | Optical parameter 193 nm | | Etching selective ratio | Lithography properties | Encapsulation |
|---|---|---|---|---|---|---|---|---|
| | PGME | PGMEA | NMD-3 | n value | k value | | | |
| Example 1 | o | o | o | 1.58 | 0.48 | 1.50 | o | o |
| Example 2 | o | o | o | 1.63 | 0.53 | 1.64 | o | o |
| Example 3 | o | o | o | 1.68 | 0.50 | 1.84 | o | o |
| Comparative Example 1 | o | o | o | 1.53 | 0.75 | 1.06 | o | x |

From the results shown in Table 1 above, it is apparent that the resist underlying films formed from the resist underlying film forming compositions prepared in Examples 1 to 3 exhibited excellent properties with respect to the solvent resistance, optical parameter, dry etching rate, and encapsulation; whereas the resist underlying film formed from the resist underlying film forming composition prepared in Comparative Example 1 had a low dry etching rate and was unsatisfactory in the encapsulation.

The above results clearly show that resist underlying films having high dry etching rate and excellent encapsulation and exhibiting an antireflection ability in an ArF process can be obtained from the resist underlying film forming compositions prepared in Examples 1 to 3.

INDUSTRIAL APPLICABILITY

The resist underlying film forming composition of the present invention provides a resist underlying film which is excellent in all of the solvent resistance, optical parameter, dry etching rate, and encapsulation properties.

The invention claimed is:

1. A resist underlying film forming composition comprising a resin comprising a unit structure represented by the following formula (1):

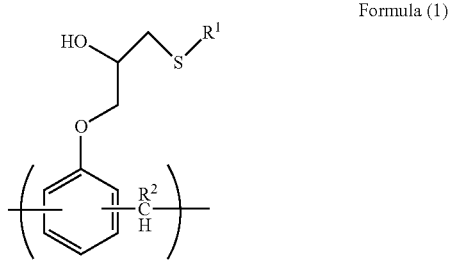

Formula (1)

wherein $R^1$ represents a $C_1$-$C_6$ alkyl group optionally interrupted by a carboxyl group, a $C_1$-$C_6$ alkyl group optionally substituted with a hydroxyl group, or a thiadiazole group optionally substituted with a $C_1$-$C_4$ alkylthio group, and $R^2$ represents a hydrogen atom or the following formula (2):

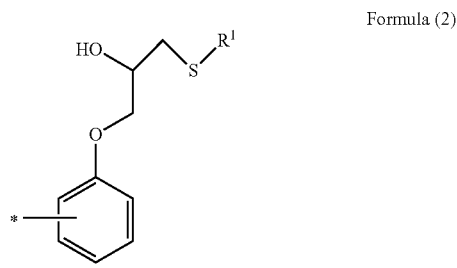

Formula (2)

wherein $R^1$ is as defined above, and * indicates a bonding site.

2. A resist underlying film forming composition comprising a resin which is a reaction product of
a resin (A) comprising an epoxy group with
a compound (B) having (a) thiol group(s) that is at least one selected from the group consisting of thioglycolic acid, thioglycolic acid monoethanolamine, methyl thioglycolate, octyl thioglycolate, methoxybutyl thioglycolate, ethylene glycol bisthioglycolate, butanediol bisthioglycolate, hexanediol bisthioglycolate, trimethylolpropane tristhioglycolate, pentaerythritol tetrakisthioglycolate, 3-mercaptopropionic acid, methyl mercaptopropionate, methoxybutyl mercaptopropionate, octyl mercaptopropionate, tridecyl mercaptopropionate, ethylene glycol bisthiopropionate, butanediol bisthiopropionate, trimethylolpropane tristhiopropionate, pentaerythritol tetrakisthiopropionate, pentaerythritol tetrakis(3-mercaptobutyrate), trimethylolpropane tris(3-mercaptobutyrate), trimethylolethane tris(3-mercaptobutyrate), thioglycerol, 4-mercapto-5-methylthio-1,2,3-thiadiazole, 4-methylthio-5-mercapto-1,2,3-thiadiazole, 3-mercapto-4-methylthio-1,2,5-thiadiazole, 3-methylthio-4-mercapto-1,2,5-thiadiazole, 2-mercapto-5-methylthio-1,3,4-thiadiazole, 2-methylthio-5-mercapto-1,3,4-thiadiazole.

3. The resist underlying film forming composition according to claim 2, wherein the resin (A) comprising an epoxy group is a phenolic novolak epoxy resin.

4. A resist underlying film which is a baked product of an applied film comprising the resist underlying film forming composition according to claim 1.

5. A method for forming a resist pattern characterized by being used for the manufacture of semiconductors, comprising the step of applying the resist underlying film forming composition according to claim 1 onto a semiconductor substrate to form an applied film, and baking the applied film to form a resist underlying film.

6. A method for producing a semiconductor device, comprising the steps of:
forming a resist underlying film comprising the resist underlying film forming composition according to claim 1 on a semiconductor substrate;
forming a resist film on the resist underlying film;
irradiating the resist film with a light or an electron beam and subjecting the resultant resist film to development to form a resist pattern;
etching the resist underlying film through the formed resist pattern to form a patterned resist underlying film; and
processing the semiconductor substrate using the patterned resist underlying film.

7. A resist underlying film which is a baked product of an applied film comprising the resist underlying film forming composition according to claim 2.

8. A resist underlying film which is a baked product of an applied film comprising the resist underlying film forming composition according to claim 3.

9. A method for forming a resist pattern characterized by being used for the manufacture of semiconductors, comprising the step of applying the resist underlying film forming composition according to claim 2 onto a semiconductor substrate to form an applied film, and baking the applied film to form a resist underlying film.

10. A method for forming a resist pattern characterized by being used for the manufacture of semiconductors, comprising the step of applying the resist underlying film forming composition according to claim 3 onto a semiconductor substrate to form an applied film, and baking the applied film to form a resist underlying film.

11. A method for producing a semiconductor device, comprising the steps of:
forming a resist underlying film comprising the resist underlying film forming composition according to claim 2 on a semiconductor substrate;
forming a resist film on the resist underlying film;
irradiating the resist film with a light or an electron beam and subjecting the resultant resist film to development to form a resist pattern;
etching the resist underlying film through the formed resist pattern to form a patterned resist underlying film; and
processing the semiconductor substrate using the patterned resist underlying film.

12. A method for producing a semiconductor device, comprising the steps of:
forming a resist underlying film comprising the resist underlying film forming composition according to claim 3 on a semiconductor substrate;
forming a resist film on the resist underlying film;
irradiating the resist film with a light or an electron beam and subjecting the resultant resist film to development to form a resist pattern;
etching the resist underlying film through the formed resist pattern to form a patterned resist underlying film; and
processing the semiconductor substrate using the patterned resist underlying film.

* * * * *